United States Patent [19]

Thomas et al.

[11] 4,227,051

[45] Oct. 7, 1980

[54] LOUD SPEAKER AND ENCLOSURE SYSTEM

[76] Inventors: Wayne W. Thomas; Walter C. Thomas, both of 301 Choctaw, Tahlequah, Okla. 74464

[21] Appl. No.: 14,908

[22] Filed: Feb. 26, 1979

[51] Int. Cl.$^2$ .................... H04R 1/28; H04M 1/00; H05K 5/00

[52] U.S. Cl. ............................ 179/1 E; 179/1 GA; 181/144; 181/146

[58] Field of Search ............. 179/1 E, 1 GA, 146 E; 181/179, 198, 146, 144, 145

[56] References Cited

U.S. PATENT DOCUMENTS

| | | | |
|---|---|---|---|
| 3,835,256 | 9/1974 | Wieder | 179/1 E |
| 3,912,866 | 10/1975 | Fox | 179/1 E |
| 3,931,867 | 1/1976 | Janszen | 179/1 E |

*Primary Examiner*—Daryl W. Cook

[57] ABSTRACT

A loud speaker and enclosure system that has improved acoustical properties, comprises a cubical frame composed of two sidewalls, a top and a bottom, having an open front and back. The frame is made of substantially rigid material. The backwall is closed by means of a panel of styro-foam. An acoustical horn in the form of a truncated square pyramid is molded from foamed plastic and is of such size as to be fitted into the inner space of the frame with the wide end of the pyramid at the front end of the frame. Means are provided at the corners of the pyramid, for attachment to the frame. Along the walls of the horn there is a space between the walls of the horn and the walls of the frame, of selected dimension. At the small end of the horn is a transverse wall, which has a circular opening. A low frequency, large diameter, cone type speaker is fastened to this wall, mounted inside of the horn, with the cone facing toward the back of the frame. A structure, is mounted to the loud speaker and supports one or more higher frequency, smaller speakers, which are faced toward the front of the frame.

15 Claims, 4 Drawing Figures

LOUD SPEAKER AND ENCLOSURE SYSTEM

BACKGROUND OF THE INVENTION

This invention lies in the field of acoustical loud speakers. More particularly it concerns a construction for a loud speaker enclosure system which has superior acoustical properties.

In the prior art there are many types of loud speaker enclosures that have been designed, many of which utilize a horn, or a folded horn. However, in all those instances known to the inventors, the horn is not truncated, and the sound enters the horn from the small end and is directed downwardly inside of the horn to the large end. In this design the reverse is true, and the sound from the principal low frequency speaker is directed into the space surrounding the horn, between the horn and the enclosure, with means for sound emergence around the circumference of the horn.

SUMMARY OF THE INVENTION

It is a primary object of this invention to provide a loud speaker and enclosure system, having superior acoustical properties.

It is a further object of this invention, to provide a loud speaker enclosure system that provides for flexible walls in the enclosure, and in the speaker mounting system, so that low frequency acoustic energy, can be transmitted through the walls and high frequency noises can be absorbed.

These and other objects are realized and the limitation of the prior art are overcome in this invention, by providing a rigid three dimensional structure, or frame, that serves as an enclosure for the speaker system and also provides a framework to support the various parts of the loud speaker system.

In one embodiment the enclosure, or frame, is in the form of a cube with side walls, top and bottom, but with no front or back wall. A back wall is provided of a planar sheet of foamed plastic, such as styrofoam, which is attached to form a back closure of the frame.

A truncated pyramidal horn is provided of selected dimensions such that it will fit within the inner walls of the frame, with the wide portion of the horn at the front end of the frame. The angle of the walls with respect to the axis of the horn is a selected angle. The horn is truncated, and provided with a closure wall at the small end, such that the plane of the closure wall is substantially halfway between the front and back planes of the frame.

A circular opening is provided in the transverse wall closing the small end of the horn, and a low frequency loudspeaker of the cone type, is mounted to that closure wall with the speaker inside of the horn and the cone facing outwardly toward the rear wall of the frame. Means are provided for mounting the horn to the frame at the front end thereof.

A suitable structure, preferably made out of foamed plastic, is provided for support of one or more higher frequency, small, loudspeakers attachable to the low frequency speaker. The small speaker, or speakers, are directed toward the front of the frame. The front may be covered with a porous cloth or screen, such as is well known in the art.

While this invention has been described in terms of a frame of square cross-section, it is possible also to provide an assembly which is rectangular in shape at the front of the frame. Such a rectangular frame would include a horn having two parallel, opposed walls, and two sloping walls. Again, as in the square design, the sloping walls of the horn are spaced from the wall at the front, to form slots of selected width at top and bottom of the frame.

In another embodiment, the frame is made in a cylindrical form, and the horn to which the speaker assembly is mounted, is a conical horn, of diameter at its wide end, which is smaller than the interior diameter of the frame, by a selected dimension. Thus when the horn is positioned inside of the frame, there will be an annular gap between the horn, and the inner surface of the frame. As in the first embodiment the cone is made of foamed plastic of a selected material and wall thickness.

BRIEF DESCRIPTION OF THE DRAWINGS

These and other objects and advantages of this invention and a better understanding of the principles and details of the invention will be evident from the following description, taken in conjunction with the appended drawings in which.

DESCRIPTION OF THE PREFERRED EMBODIMENT

Figure 1:
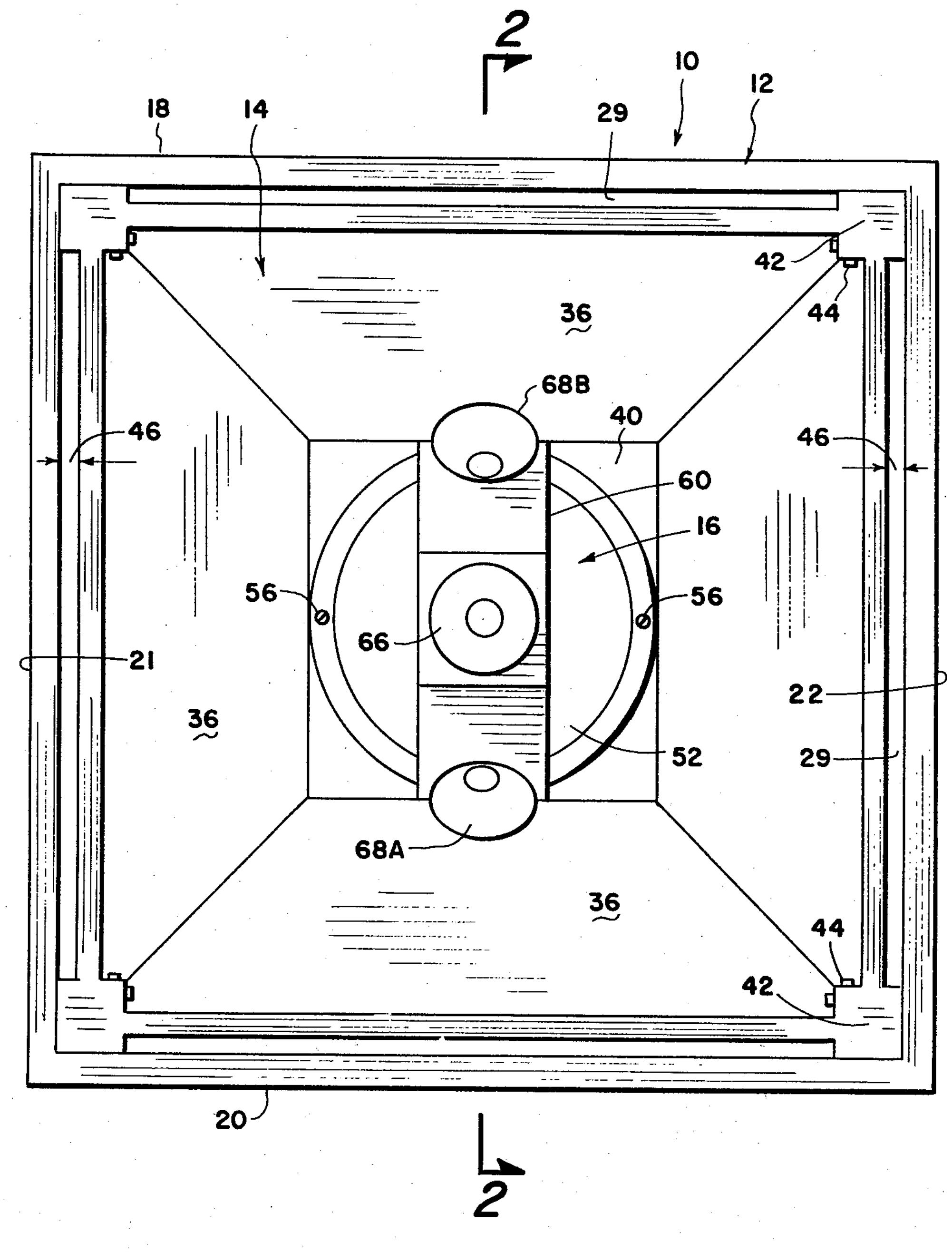
FIGS. 1 and 2 show front view and side view in section, of one embodiment of this invention.
Figure 2:
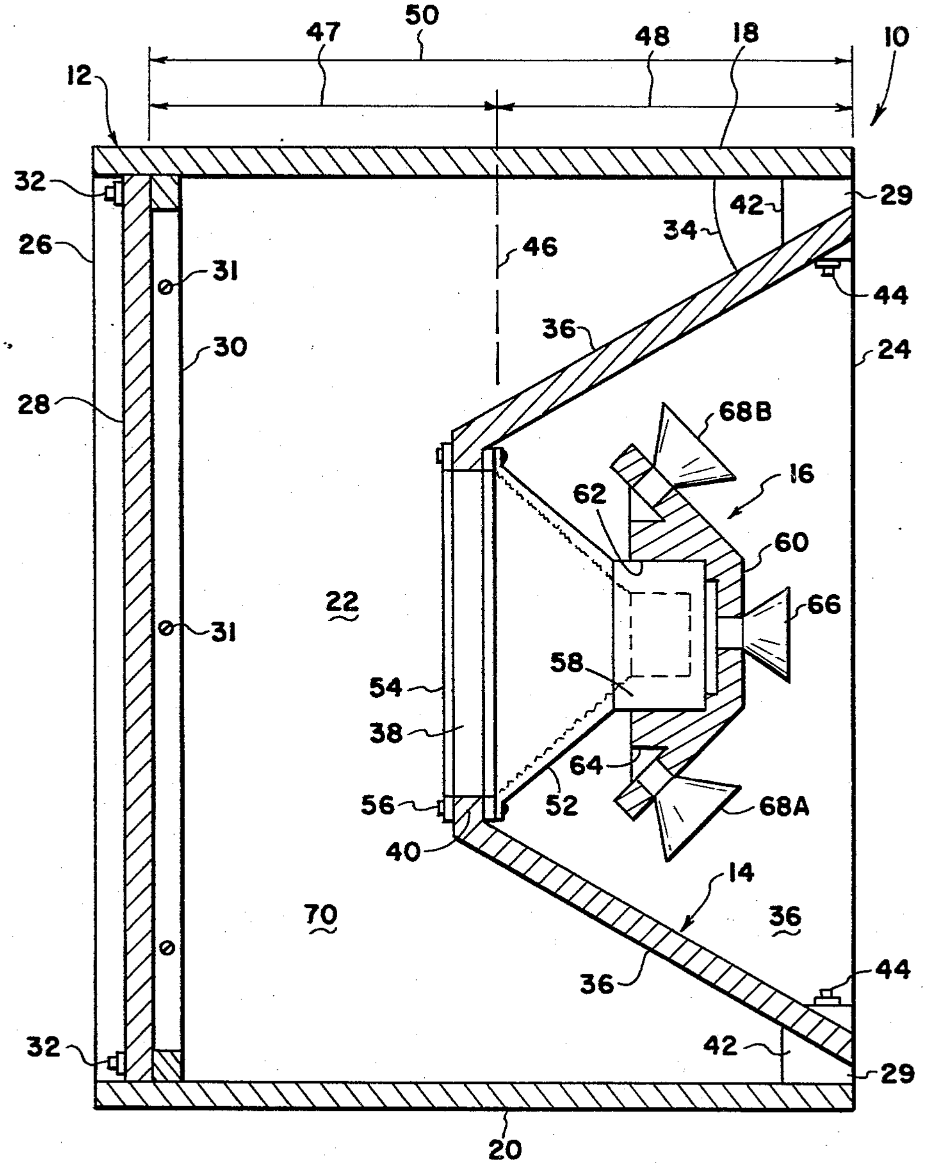

Referring now to the drawings and in particular to FIGS. 1 and 2, there are shown two views of one embodiment of this invention. FIG. 1 illustrates a front view of the invention, indicated generally by the numeral 10. FIG. 2 illustrates a side view, in section, of the same embodiment, taken along the plane 2—2 of FIG. 1.

The enclosing structure of the assembly, or system, is a frame of approximately cubical shape, indicated generally by numeral 12. This includes a top 18 and a bottom 20, with two sidewalls 21 and 22, fastened together to form a rigid enclosure. The frame has no front or back walls.

As seen in FIG. 2, the back is closed off by means of a panel 28 of foamed plastic, such as styrofoam, which is supported inside of the frame 12, and attached to strips 30 which are supported to the frame 12 by means screws 31, and so on, as is well known in the art. The styrofoam panel 28 closing off the back end of the frame 13 can be of thickness in the range of $\frac{3}{4}''$ to 1''. This provides sufficient strength and rigidity of the panel, but also because of the plastic properties of the material provides the ability to vibrate and transmit acoustical waves impinging on the inner surface and transmitting them outwardly from the back surface.

The principal structure that holds the speakers, is a horn indicated generally by the numeral 14. In FIGS. 1 and 2 this is a truncated pyramidal horn of square cross-sections, of selected angles 34 with respect to the axis of the horn. This horn can be molded in one piece from suitable foamed plastic, and would have 4 tapering walls 36, and a transverse wall 40 closing off the small end of the horn. The wall 40 has a central circular opening 38 of such size as to approximately equal the diameter of a speaker 52, of the cone type, which is fastened by conventional means to the transverse wall 40. The fastening can be by support ring 54 and screws 56.

At the large end of the horn 14 there are fixtures 42 molded into the corners, such as will adapt for the tapered horn to fit snuggly into the corners of the frame 12. The horn can be fastened to the frame 12 by means such as screws 44, or other suitable fasteners. As seen in FIG. 1, the walls 36 are spaced from the inner surface of the frame 12 by gaps 29, which are of width, a selected dimension 46.

The sound generated by the speaker 52, facing backward into the space 70 behind and outside of the horn, is transmitted outwardly partially by vibration of the back wall panel 28, and also by transmission of sound outside of the horn, and through the apertures, or slots, 29 and out to the front of the enclosure. There will be transmission of sound from the back surface of the cone of the speaker 52. There will also be lateral vibration, of the walls 36 of the horn, all of which together provides a flat response of considerable breadth, from very low to high frequencies.

The speaker 52 has an enclosure 58 around the magnet. A support member 60 is molded of styrofoam, or other suitable foam plastic, with a cylindrical opening 62, adapted to fit over the magnet structure 58 of the speaker. This fixture 60 can be clamped around the cylindrical surface 64, so as to be held tightly to the magnet 58 of the speaker 52.

This foamed plastic structure 60 serves to support, in any selected manner, one or more higher frequency loud speakers, such as a tweeter 66, which is mounted facing to the front, and one or more midrange speakers 68A, 68B. These intermediate range speakers would complete the full range of frequency from the high tweeter frequencies down to the low requencies of the woofer speaker 52.

While we have shown in FIG. 1 that the horn 14 is a symmetrical pyramid, and is fitted symmetrically into the square frame 12 to provide four openings 29 symmetrically positioned, it is possible also to provide other shapes of horns and enclosures. For example, in FIG. 3 there is shown a variation of FIG. 1, in which the horn is comprised of a structure which has two parallel walls 76, and two sloping walls 36A, of slope angles similar to those of FIG. 1. This could be fitted into a rectangular frame 12A, to provide two slots or openings 29A at top and bottom, similar to those of FIG. 1. The transverse wall 40 of the horn 14A in FIG. 3, would be substantially identical to that of FIG. 1, as would be the speaker assembly 16 for the two embodiments.

Figure 4:
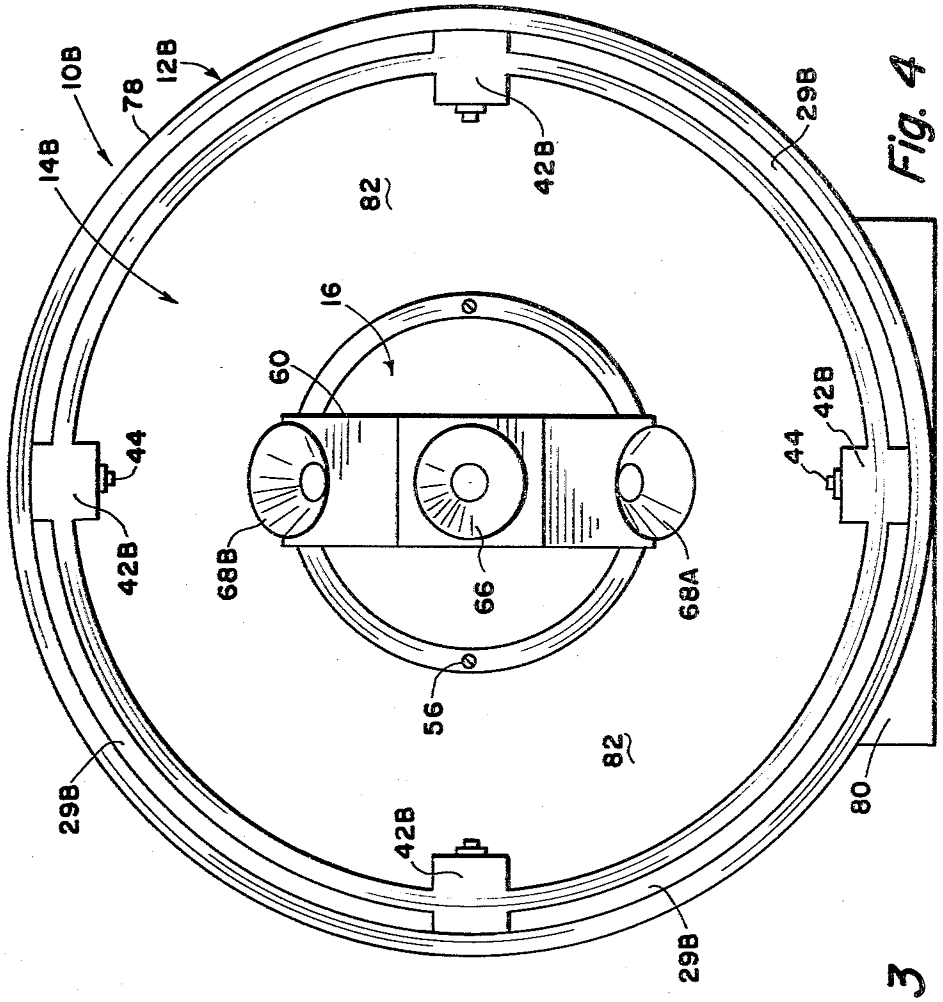
FIG. 4 is a front elevation view of a third embodiment of this invention.

In FIG. 4 is shown a third embodiment, which has a circular symmetry. Here the frame 12B is a cylindrical, substantially rigid frame. As in the case of FIG. 2, the back wall is closed with a circular styrofoam panel, not shown. The front is partially closed by a conical horn 14B, which is fastened at a plurality of points to the interior surface of the frame, by means of cast members 42B, made of the same foam plastic of which the horn 14B is cast. In this case the transverse wall across the small end of the horn, would be circular in shape and in the form of an annular wall, just sufficiently wide to support the loud speaker assembly 16 in a manner similar to that shown in FIG. 2.

Here again the horn is shown assembled symmetrically within the circular frame, providing an annular opening 29B between the outer perimeter of the horn and the inner wall of the frame.

Figure 3:
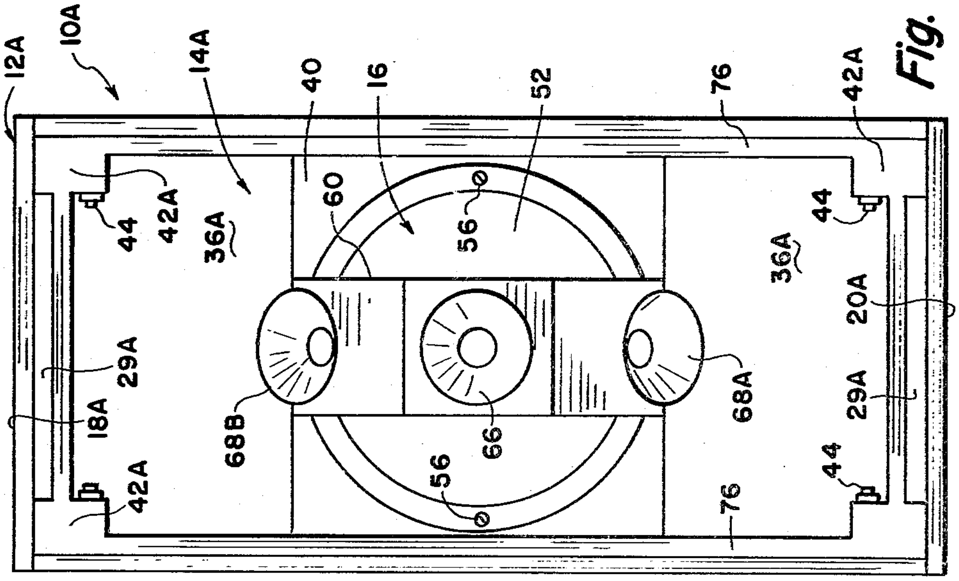
FIG. 3 is a front elevation view of a second embodiment of this invention.

In both FIGS. 3 and 4, the speaker assemblies 16 are identical, and are supported from the transverse wall 40 by conventional means, such as support rings 52 and screws 56 for example.

In all three embodiments, the slope angle of the walls of the horn are substantially the same, namely at an angle 34 to the axis of the horn 14, or to the walls of the enclosure 12. This angle 34 of the wall of the horn 14 can be in the range of 15°–30°. More preferably it can be in the range of 20°–25°. The optimum angle has been found to be 23°.

The wall thickness of the sytrofoam horn 14, like that of the back panel 28 is in the range of ¾" to 1".

The position of the transverse wall 40 is substantially in the midplane 46 between the front face 24 of the frame, and the back closure panel 28. Thus, as in FIG. 2 dimensions 47 and 48 are substantially equal, and half of the dimension 50.

One characteristic of this invention is that low frequency energy is directed into the space surrounding the horn, where part of the enclosing walls are made of flexible foamed plastic, whereas the high frequency energy is directed directly to the front of the enclosure, from inside of the horn.

While the invention has been described with a certain degree of particularity, it is manifest that many changes may be made in the details of construction and the arrangement of components. It is understood that the invention is not to be limited to the specific embodiments set forth herein by way of exemplifying the invention, but the invention is to be limited only by the scope of the attached claim or claims, including the full range of equivalency to which each element or step thereof is entitled.

What is claimed is:

1. A loud speaker assembly and enclosure system, comprising;

(a) a three dimensional frame enclosing a volume of selected shape, and having an open front and back; said frame, made of substantially rigid material;

(b) means to enclose said back of said frame with a planar sheet of foamed material of selected composition and thickness, attached to said frame;

(c) a truncated tapering horn, of overall dimension across the large end, a selected dimension less than the internal dimension of said frame; said horn made of foamed material of selected composition and wall thickness; and small end of said horn closed with a wall of said foamed material; and means to support said horn to said frame at a plurality of points around the perimeter of said horn, near the front end of said frame, such that when said horn is positioned inside said frame, the space between said horn and said back closure communicates with the front of said frame through openings of selected width over at least a portion of its perimeter;

(d) a circular opening in the transverse wall across the small end of said horn, and means to mount a large diameter cone speaker, inside said horn, across said circular opening, facing to the back of said frame; and (e) means to mount at least one high frequency speaker, inside said horn, facing toward the front of said frame.

2. The assembly as in claim 1 in which said frame and said horn are rectangular in cross-section, and said horn is supported in said frame at the four corners.

3. The assembly as in claim 2 in which said horn is positioned inside said frame, including at least one opening along at least one wall of said horn, said at least one opening of selected width.

4. The assembly as in claim 1 including also at least one intermediate frequency speaker mounted inside said horn facing toward the front of said frame.

5. The assembly as in claim 1 in which said frame and said horn are circular in cross-section and said horn is supported in said frame at a plurality of points around its perimeter.

6. The assembly as in claim 5 in which said horn is positioned inside said frame including at least one opening along at least a portion of its perimeter, said opening of selected width.

7. The assembly as in claim 5 in which said horn is symmetrically positioned in said frame, providing an annular opening between the perimeter of said horn and the inner surface of said frame.

8. The assembly as in claim 1 in which the slope of the wall of said horn makes an angle with the axis of said horn in the range of the 15° to 30°.

9. The assembly as in claim 8 in which said angle is in the range of 20° to 25°.

10. The assembly as in claim 8 in which said angle is 23°.

11. The assembly as in claim 1 in which said opening between the perimeter of said horn and the inner surface of said frame is of width in the range of $\frac{1}{4}$" to $\frac{3}{4}$".

12. The assembly as in claim 11 in which said width is in the range of $\frac{3}{8}$" to $\frac{1}{2}$".

13. The assembly as in claim 1 in which the mounting plane of said large diameter cone speaker is approximately midway between the planes of the front and back of said frame.

14. The assembly as in claim 1 in which said planar sheet of foamed material is of thickness in the range of $\frac{3}{4}$" to 1".

15. The assembly as in claim 1 in which said truncated tapering horn is of wall thickness in the range of $\frac{3}{4}$" to 1".

* * * * *